United States Patent [19]

Froment et al.

[11] Patent Number: 4,607,139

[45] Date of Patent: Aug. 19, 1986

[54] INTERFACE MODULE FOR TELEPHONE LINES

[75] Inventors: Jean-Claude Froment, Villeneuve-Loubet; Jean-Pierre Pantani, Saint Jeannet; Michel Verhaeghe, Vence, all of France

[73] Assignee: International Business Machines Corp., Armonk, N.Y.

[21] Appl. No.: 618,010

[22] Filed: Jun. 6, 1984

[30] Foreign Application Priority Data

Jun. 30, 1983 [EP] European Pat. Off. ........... 83430020

[51] Int. Cl.$^4$ ........................................... H04M 11/00
[52] U.S. Cl. ................................................... 179/2 C
[58] Field of Search .................... 179/2 C, 2 DP; 375/7–9

[56] References Cited

U.S. PATENT DOCUMENTS

| | | | |
|---|---|---|---|
| 3,716,672 | 2/1973 | Fretwell | 179/2 DP |
| 3,743,938 | 7/1973 | Davis | 179/2 DP |
| 4,039,751 | 8/1977 | Couturier et al. | 179/15 BF |
| 4,070,545 | 1/1978 | Diefenderfer | 178/73 |
| 4,203,006 | 5/1980 | Mascia | 179/2 C |

OTHER PUBLICATIONS

*IBM Technical Disclosure Bulletin*, vol. 21, No. 11, Apr. 1979, pp. 4559–4560, F. Delaporte et al, "Logic Interface Module".

*Primary Examiner*—Keith E. George
*Attorney, Agent, or Firm*—John B. Frisone

[57] ABSTRACT

A monolithic module acting as the interface between a modem and leased ("LL") or switched ("SL") telephone lines, mainly characterized in that: 1. It can be formed on a silicon chip (due to the absence of electro-mechanical relays or similar switching means), and 2. Its architecture is such that it makes it possible, by interconnecting or "stacking" identical modules, not only to attach additional telephone lines, but also to increase the number of allowable modem configurations. The module (10, 10') comprises two controlled-type line amplifiers (DLL, DSL) which exhibit a high output impedance regardless of whether the power supplies are "on" or "off"; two controlled-type line receivers (RSL, RLL) which provide a very high input impedance whether the power supplies are "on" or "off"; and a wrap receiver (WRP) for testing the modem (to the exclusion of the telephone lines) and interconnecting or "stacking" identical modules. The figure shows an embodiment wherein two of the modules are interconnected; various configurations can be obtained depending on the logic state of the control inputs (1 to 4 for module 10 and 1' to 4' for module 10') supplied by the modem.

8 Claims, 12 Drawing Figures

INTERFACE MODULE FOR TELEPHONE LINES

DESCRIPTION

1. Technical Field

This invention relates to the field of data transmission and, more particularly, to a monolithic module formed on a silicon chip and acting as the interface between a modem and a plurality of telephone lines.

2. Background Art

As is known, PTT standards specify the transmission levels and impedances, as seen by the line, that correspond to three distinct states of the modem, as shown in Table I below:

TABLE I

| MODEM STATE | TRANSMISSION LEVEL | IMPEDANCE |
| --- | --- | --- |
| ON | 0db | 600 ± 20% |
| IDLE | −80db | 600 ± 20% |
| OFF | — | 600 ± 20% |

The PTT standards also specify the limits of the amplitude/frequency characteristic and require that the signal exhibit a high degree of linearity. It should be noted that the modem is "on," "idle" or "off," the telephone line must always be terminated in 600 ohms.

There exist in the prior art many circuits designed to act as the interface between a modem and PTT lines, either through a coupling device if switched lines are involved, or through line transformers in the case of leased lines. To applicants' knowledge, all existing interface circuits use the following basic components in both the transmission and reception modes: an active circuit that includes an operational amplifier; a passive circuit, usually consisting of a 600-ohm resistor; and a switching circuit, mainly consisting of an electronic relay or an electromechanical relay (such as a reed relay), the operation of which is dependent upon the "on," "off" or "idle" state of the modem.

Let us now consider by way of example a transmission involving a leased line.

In a first embodiment of a known type, the output impedance of the amplifier is much lower than 600 ohms. The primary of the line transformer is connected through a 600-ohm resistor to the common node of the relay, the operation of which is dependent on the state of the modem. If the modem is "on," the common node is connected to the output of the amplifier; in the "off" or "idle" state of the modem, the common node is connected to ground.

In a second known embodiment, the line amplifier exhibits an output impedance of 600 ohms. In this case, the primary of the line transformer is directly connected to the common node of the relay. If the modem is "on," the common node is connected to the output of the amplifier; if the modem is "off" or "idle," the common node is connected to ground through a 600-ohm resistor. The relay is controlled through a logic circuit which is an integral part of the modem.

In both cases, the requirements shown in Table I are met. The circuitry at the receiving end is identical to that at the transmitting end.

Thus, in the prior art, the card acting as the interface between the modem and the telephone lines comprises, for each line connected to the transmitting and receiving portions of the modem, a line amplifier, at least one discrete matching resistor of 600 ohms, and a switching relay.

There are drawbacks to the presence of electromechanical or electronic relays in such circuits. Obviously, electromechanical relays are discrete components that cannot be integrated into monolithic circuits and whose shortcomings, from the standpoints of power consumption, space requirements, reliability, cost, etc. are well known. Electronic relays manufactured in FET technology have mainly been used until now. However, a major disadvantage of such relays is that they exhibit a significant resistance (Ron) of the order of 100 ohms when conducting in the forward mode and that this characteristic occurs erratically in the fabricated devices. Electronic relays could also be fabricated in bipolar technology but these would be unsuitable in that, to achieve proper isolation of their components such as transistors and resistors integrated into the epitaxial layer of a silicon substrate, voltages would have to be continuously supplied to reverse bias the junction between the epitaxial layer, on the one hand, and the substrate and the isolation walls, on the other. Since, in the present application, no supply voltages are available when the modem is "off," this type of electronic relay would operate in a random manner and the matching requirements set forth in Table I would not be met.

It is important to note that each amplifier is dedicated to a single line. In the event of a line being disabled during operation of the modem, the amplifier associated therewith would become useless. To overcome this difficulty, additional relays could be provided to route to some other line the data applied to the useless amplifier, but that amplifier would then be needlessly overloaded, assuming the use of leased lines, since the primaries of two transformers would be connected in parallel. Also, if it were desired to add any transmission lines, it would be necessary not only to provide additional circuits, and in particular additional relays, but also to modify the basic circuitry.

From the foregoing, it is seen that the architecture of existing interface circuits lacks flexibility.

DISCLOSURE OF THE INVENTION

In view of the shortcomings of prior art interface circuits, there is a need for a module that can act as the interface between a modem and telephone lines and satisfy the following requirements:
- the module must be a monolithic circuit formed on a silicon chip and capable of operating even when the modem is "off," in the complete absence of supply voltages;
- its power consumption must be minimal and it must exhibit an optimum cost/performance ratio;
- its architecture must provide a high degree of flexibility, in order to accommodate various modem configurations; and,
- its architecture must permit increasing the number of lines over which transmission is desired through the simple addition or "stacking" of interconnected identical modules, without having to modify the basic circuitry.

It is an object of the present invention to meet these requirements through the use of an architecture that provides the desired flexibility and modularity, as stated in detail in claim 1. More precisely, it is another object of this invention to provide this architecture in the form of a monolithic circuit by eliminating all switching functions formerly performed by electromechanical or electronic relays, and to ensure that the matching requirements of the PTT are satisfied regardless of whether the modem is in the "on," "off" or "idle" state.

These objects are generally attained through the development, on the one hand, of a family of novel line amplifiers that exhibit a high degree of linearity when the modem is "on," good isolation when the modem is "idle" or "off," and a high output impedance in all cases, including the "off" state, in order not to perturb the telephone network (every line of which will be permanently connected to a discrete 600-ohm resistor), and, on the other hand, of a family of novel line receivers, in the manner described in the sub-claims.

The foregoing and other objects, features and advantages of the invention will be apparent from the following more particular description of a preferred embodiment of the invention, as illustrated in the accompanying drawings.

DETAILED DESCRIPTION OF THE INVENTION

1. Architecture of the Basic Module

Figure 1:
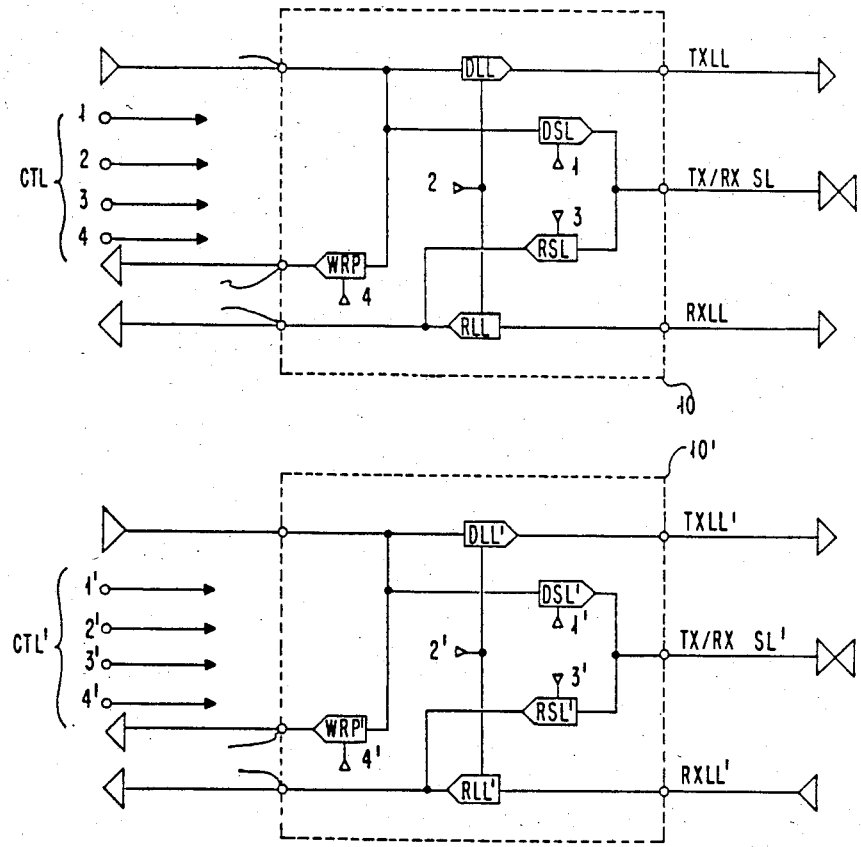
FIG. 1 is a schematic diagram showing the architecture of two identical modules that can be stacked and are in accordance with the invention.

FIG. 1 is a schematic diagram of the architecture of two identical modules 10 and 10' in accordance with the invention. Module 10 includes two line amplifiers DLL and DSL, respectively, associated with a leased line labeled TXLL and a switched line labeled TX/RX SL. The inputs of these amplifiers are connected to a common node labeled TX DATA that receives the data to be sent over the transmission lines of the modem. Two receivers RLL and RSL receive the data sent over a leased line labeled RXLL and over switched line TX/RX SL, respectively. The outputs of these receivers are connected via a common node labeled RX DATA to the receiving portion of the modem. Although the switched line TX/RX SL shown in FIG. 1 is intended to represent a four-wire full-duplex line, it should be understood that this could be replaced by a couple of two-wire half-duplex lines respectively used for transmitting and receiving signals. Module 10 also includes an additional receiver labeled WRP which is identical to receivers RLL, RSL and is disposed between common node TX DATA and a node labeled WRP OUT. Receiver WRP is an important component in that it is used, in particular, to interconnect identical modules when "stacking" is desired. Receiver WRP is identical to RLL and RSL, but is never connected to PTT lines. It will be observed that module 10 includes no switching circuits such as relays, and that the amplifiers and receivers are controlled circuits in the sense that their operation is dependent upon the logic levels applied to the control inputs designated 1, 2, 3 and 4. The implementation of these circuits will be described later in detail. Inactive circuits are placed in a high impedance state. Two identical modules 10 and 10' are shown in FIG. 1 because, as will be explained, they can be combined to meet the individual requirements of various modem configurations, thereby demonstrating the advantages of said architecture.

2. Line Amplifiers

In order to eliminate the switching circuits (or relays), this invention discloses the use of a line amplifier exhibiting an output impedance much higher than 600 ohms, regardless of whether the modem is in the "on," "idle" or "off" state. To permit a comparison with the conventional embodiments alluded to earlier, we shall consider that the primary of the leased line transformer is permanently connected to a parallel 600-ohm resistor and to the output of a line amplifier exhibiting an output impedance much higher than 600 ohms, regardless of whether the modem is "on," "idle" or "off." This amplifier is a controlled type of device, that is, it has a control input CTL (designated 1 and 2 for DSL and DLL, respectively) to cause the amplifier to assume a specific state depending upon the state of the modem.

Figure 2:
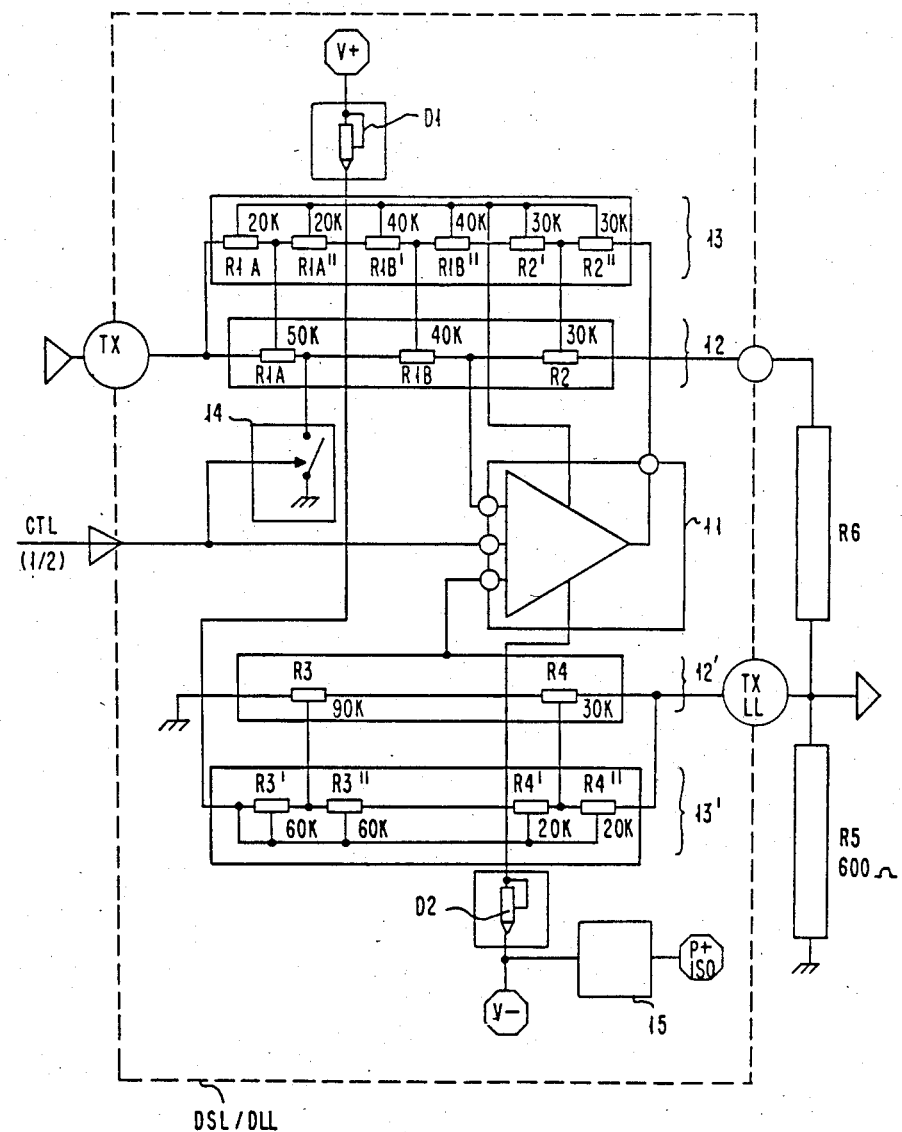
FIG. 2 is a schematic drawing of a novel line amplifier that includes a controlled-type operational amplifier in accordance with the invention.

FIG. 2 illustrates a circuit which meets these requirements. This figure shows one of the two line amplifiers DLL and DSL of FIG. 1.

For simplicity, it will be assumed that these amplifiers are identical. Such a line amplifier includes a novel controlled-type operational amplifier 11. This amplifier has two characteristics that are not conventional, namely, it is a tristate amplifier and can provide a high impedance (HI) output even when the modem is "off," i.e., in the absence of supply voltages. An embodiment of the line amplifier is shown in detail in FIG. 3. In order for the output impedance of the line amplifier to be quasi infinite, two networks of implanted resistors are formed in operational amplifier 11. Resistor network 12, 12' acts as a current generator when the modem is "on." The pairing of these resistors can easily be controlled, thereby ensuring that the output impedance of the circuit of FIG. 2 will be very high when the modem is "on." The "mirror image" resistor network 13, 13' is intended to correct the lack of linearity of the output signal that is due to the voltage coefficient of resistance (VCR) of the resistors in network 12, 12' referred to hereafter as the "main network." The principle of operation of these networks of resistors is described in U.S. Pat. No. 4,164,668.

An analog switch 14 connected between resistor R1A and ground is controlled by the signals present on input wire CLT of the line amplifier. This switch satisfactorily isolates the input of the amplifier from the output thereof and vice versa when the modem is "idle," thereby preventing the signal from propagating to the telephone line through resistor network 12.

Switch 14 (which is opened when the amplifier is "on") is disposed between the physical ground of the module and the virtual ground of network 12 and does not perturb the circuit when the modem is "on" because of the small voltage swing of the signal applied thereto.

However, when the modem is "off" or "idle," switch 14 is closed (exhibiting at this time an impedance of less than 50 ohms) and serves to attenuate, by means of the two resistor networks, the signals transmitted from the input to the output of the line amplifier to achieve a rejection rate (input to output) of −80 dB in accordance with Table I.

A diode D1 biases the beds of the resistors in both networks by preventing leakage currents when the modem is "off." Also, diode D1 increases the protection of operational amplifier 11, by ensuring that the value of the impedance seen by the telephone line will be high with respect to ground.

A diode D2 is associated with a special isolation biasing circuit 15 for preventing the leakage currents from reaching the isolation walls when the modem is "off."

Special circuit 15 is disposed between P+ isolation walls and voltage source V−. This circuit and its function will be described later.

Lastly, the line amplifier includes two discrete resistors, namely, a matching resistor R5 which maintains the output impedance at 600 ohms and a detection resistor R6 of about 80 ohms serving to adjust the transconductance value I/V of the circuit as necessary.

Figure 3:
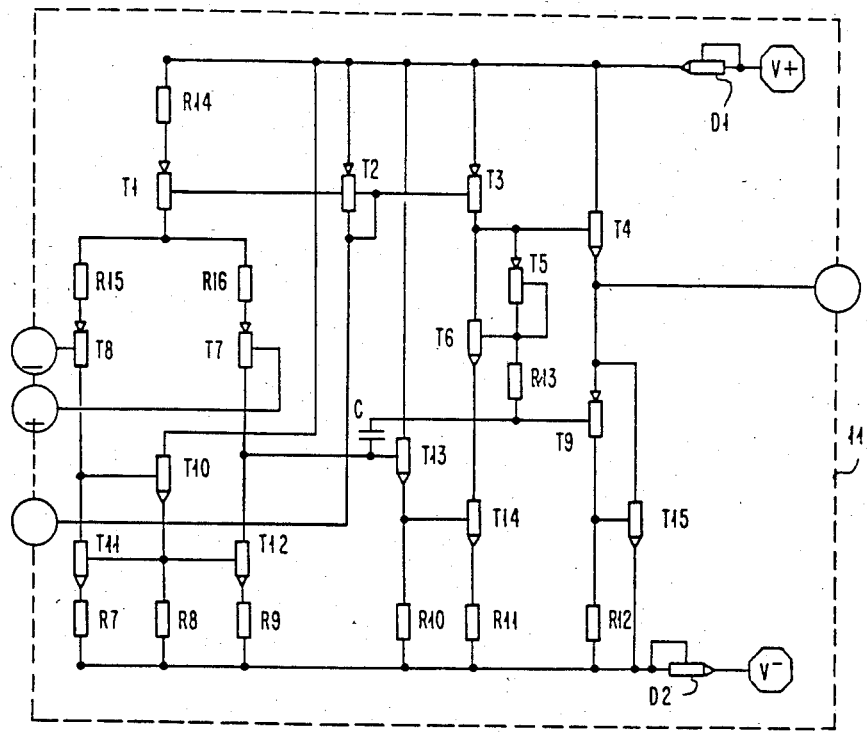
FIG. 3 shows a preferred embodiment of said controlled-type operational amplifier.

Referring now to FIG. 3, a preferred embodiment of controlled-type operational amplifier 11 is shown.

Operational amplifier 11 comprises an input stage, a voltage amplifier stage, and an output stage acting as a current amplifier.

The input stage, which is a differential amplifier stage, comprises transistors T1, T7, T8, and T10–T12.

Transistors T10–T12 are active loads which also act as a current mirror circuit. Transistor T1, connected as a current source, biases the input stage, the output of which, taken from the common node between the collectors of T7 and T12, drives the voltage amplifier stage.

The voltage amplifier stage comprises transistors T13 and T14 connected as a Darlington pair and associated with a transistor T3 forming an active load. These three transistors are associated with a compensating capacitor C and provide a voltage gain that is very high at low frequencies, but decreases at the rate of 6 dB per octave at higher frequencies. As a result, the gain of this stage is less than unity when the phase shift between the input and the output tends toward 180° (stability criterion).

The output from this stage drives the bases of transistors T4 and T9 in an emitter-follower configuration.

PNP transistor T9 is associated with a NPN transistor T15 to form a "super PNP" the function of which is to complement that of NPN transistor T4.

The output stage is biased by transistors T5 and T6 which provide a minimum steady-state current in both T4 and the super PNP, thereby assuring the linearity of the output stage.

Thus, the output, taken from the common node between the emitters of T4 and T9, duplicates the voltage across T3, which acts as a load.

Diodes D1 and D2, associated with the special isolation biasing circuit 15 mentioned earlier, ensure that the output from the operational amplifier is isolated from the voltage sources when the modem is "off" or "idle."

When the modem is "on," the output impedance of the operational amplifier is low. When the modem is "off" or "idle," the output impedance is high and all junctions between the output and voltage source V+ or V− are non-conducting.

The operation of the circuit of FIG. 2 is as described below, depending upon the state of the modem:
with the modem "on":
The structure comprised of amplifier 11, resistor networks 12, 12', 13, 13', and resistor R6 acts as a high impedance current generator for the telephone line. The current is proportional to the voltage level at the input (TX DATA) of the circuit. With the modem "on," analog switch 14 exhibits a high impedance. The output impedance of the circuit is determined by 600-ohm resistor R5. The linearity of line amplifier DSL/DLL is very high (distortion <0.2%).

The circuit of FIG. 2 meets the PTT specification applicable to data transmissions over a telephone line, namely:
maximum transmission level: 0 dBm, and
impedance seen by the line: 600 ohms±20%.
with the modem "idle":
In this case, no current is generated by the circuit, which exhibits the same output impedance as when the modem is "on." The output impedance of the circuit, as seen by the line, is determined by the discrete 600-ohm resistor.

The circuit inhibits the transmission of data and provides suitable isolation of the modem and the telephone line:
maximum transmission level: −80 dBm, and
impedance seen by the line: 600 ohms±20%.
with the modem "off":
In this case, the output impedance of the circuit as seen by the line must be the same as when the modem is "on" or "idle," even though all supply voltages have been removed. This is made possible by the special design of the output stage of the operational amplifier and the special biasing of the beds of the associated resistors. As before, the circuit meets PTT requirements:
impedance seen by the line: 600 ohms±20%.

Thus, in all cases, the impedance seen by the line is 600 ohms.

3. Line Receivers

Figure 4:
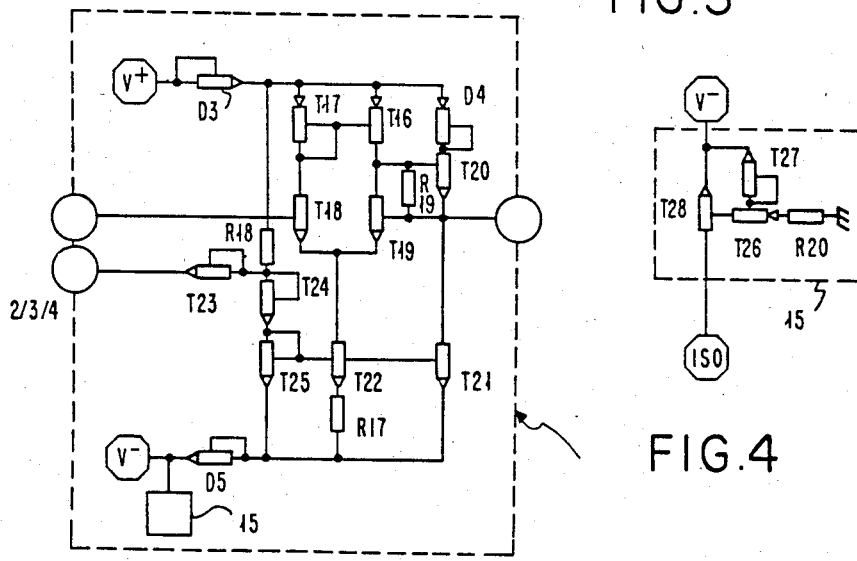
FIG. 4 is a schematic diagram of a novel line receiver in accordance with the invention.

For simplicity, the line receivers designated RSL, RLL and WRP in FIG. 1 shall be assumed to be identical. A suitable controlled-type receiver is schematically shown in FIG. 4. A conventional emitter-follower circuit comprising transistors T16–T22 and resistors R17 and R19 is associated with a conventional control device that includes transistors T23–T25 and resistor R18 for activating or inhibiting the emitter-follower circuit according to the voltages applied to terminal CTL (corresponding in this instance to logic inputs 2, 3 or 4 of FIG. 1). New functions are provided by adding three diodes D3–D5 and the special isolation biasing circuit 15. The purpose of the three diodes is to isolate the output of the emitter-follower emitter-follower circuit from voltages V+ and V− when the modem is "off."

More specifically, the receiver comprises an input stage, an output stage, and a control circuit. The input stage comprises transistors T18, T19, and two loads consisting of transistors T16 and T17. The receiver, biased by a current source consisting of T22 and R17, forms a differential amplifier stage the output of which, taken from the connection between the collectors of T16 and T19, is in phase with the input. The output stage consists of T20 in an emitter-follower configuration, and T21. This transistor, acting as a current source, serves to bias T20 and to enable the output to be fed back to the input stage, thereby forming an amplifier of gain equal to unity characterized by a high input impedance and a low output impedance. Current sources T21 and T22, R17 are biased by the control circuit when the input signal applied thereto is high, in which case the current is set by components R18, D3, T24 and D5 and the receiver acts as an emitter-follower circuit with a gain equal to unity.

When the input signal applied to the control circuit is at a low level, transistor T25 and, therefore, transistors T21 and T22 used as current sources become non-conductive. The input and output stages are no longer biased. The input of the receiver is then satisfactorily isolated from the output thereof (minimum rejection: 80 dB).

Special circuit 15 has a dual purpose: to allow the P+ isolation walls of the chip to be properly biased when the modem is powered (i.e., when it is "on" or "idle"); and to isolate the P+ walls from voltage source V− when the modem is "off," thereby preventing a short-circuit between the epitaxial regions (which contain the collectors of the NPN transistors and voltage source v− (which at this time is equal to ground potential).

Transistor T28 acts as a switch. With the modem "on" or "idle," T28 is saturated because it is biased by R20 and T26. With the modem "off," T28 isolates the P+ isolation walls from voltage source V− when V− becomes equal to ground potential.

When the modem is "on," the receiver exhibits a high input impedance and a low output impedance. The function of the receiver is to reproduce the signals from the transmission line with a 0 dB attenuation and a very high linearity. When the voltage at input CTL exceeds 0.6 volt, resistor R18 provides the biasing current for the entire circuit of FIG. 4. The circuit is then equivalent to a conventional emitter-follower circuit and the input signal is available at the output, as though a short-circuit existed between the input and the output of the circuit.

When the modem is in the "idle" state, the receiver is not affected by disturbances which may occur on the transmission line. The potential at input CTL is then less than 0.6 volt and resistor R18 no longer provides any biasing current. All transistors in the circuit are in the non-conductive state, as though an open circuit existed between the input and the output of the circuit.

When the modem is "off," an appropriate impedance (of 600 ohms) must be present at the input of the receiver. As in the instance of the line amplifier (DLL, DSL), the primary of the line transformer is permanently connected to a parallel 600-ohm resistor and to the input of the receiver, which exhibits an impedance much higher than 600 ohms. In the absence of supply voltages, all transistors are off, but satisfactory isolation is provided by diodes D3–D5 and special circuit 15. The entire circuit is then equivalent in function to a normally-open contact of a relay.

The isolation characteristics for all three cases are given below:

TABLE II

|  | V− | V+ | GROUND | INPUT | OUTPUT |
|---|---|---|---|---|---|
| INPUT | YES | YES | YES | — | YES |

4. Uses in Various Modem Configurations

While a module such as 10 can be used alone, the combination of two such modules makes it possible to meet the requirements of various modem configurations and demonstrates the flexibility of the architecture of the basic module. To this end, the preliminary connections described below must be made regardless of the modem configuration involved:

connect terminal WRP OUT of module 10 to terminal TX′ DATA of module 10′; connect terminals WRP′ OUT and RX′ DATA of module 10′ to terminal RX DATA of module 10;

connect terminals RXLL and TXLL′ to ground.

Figure 5A:
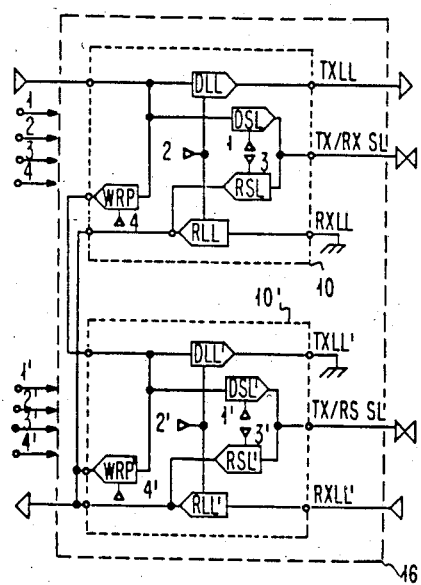
FIGS. 5A-5H show the various configurations obtained when combining two modules in accordance with the invention.
Figure 5B:
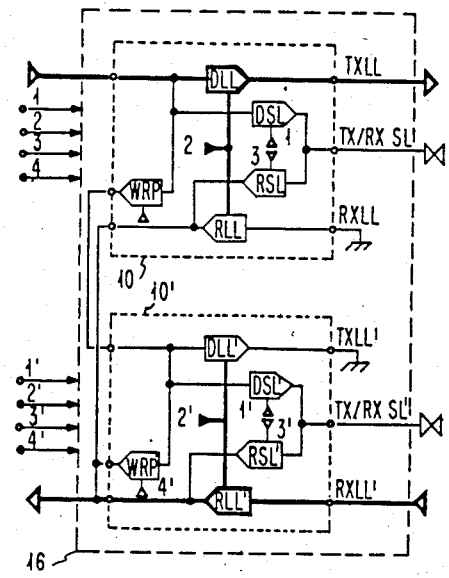

Module 16 shown in FIG. 5A is obtained by combining modules 10 and 10′ interconnected in the manner just described.

A truth table is given below by way of example for the following modem configurations:

transmit-receive modes, 4-wire leased line (LL/DATA 4W);

transmit-receive modes, 4-wire switched line, three different configurations: SWL(1)4W, SWL(2)4W, SWL(3)4W;

receive mode, leased line, "idle" state (LL IDL);

transmit mode, leased line, power failure (LLPF);

test mode (WRP).

TABLE III

| LOGIC INPUTS | | MODEM CONFIGURATIONS | | | | | | |
|---|---|---|---|---|---|---|---|---|
| | | LL/DATA 4W | SWL (1) 4W | SWL (2) 4W | SWL (3) 4W | LL IDL | LL PF | WRP |
| 1 | MOD- | + | 0 | + | 0 | + | × | + |
| 2 | ULE | 0 | + | + | + | + | 0 | + |
| 3 | 10 | + | 0 | + | + | + | × | + |
| 4 |  | G | G | G | G | G | G | G |
| 1′ | MOD- | + | + | 0 | + | + | × | + |
| 2′ | ULE | 0 | + | + | + | 0 | × | + |
| 3′ | 10′ | + | + | 0 | 0 | + | × | + |
| 4′ |  | + | + | + | + | + | × | 0 |
| See FIGS. → |  | 5B | 5C | 5D | 5E | 5F | 5G | 5H |

Key: x="don't care" logic state

0 = <0.8 V "on" state

+ = >2.4 V "idle" state

G=permanent connection to ground.

FIGS. 5B–5H show the data paths and the logic states of the various control inputs.

Figure 5C:
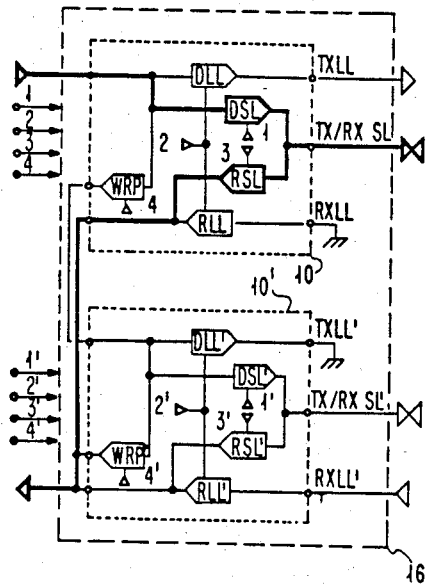
Figure 5D:
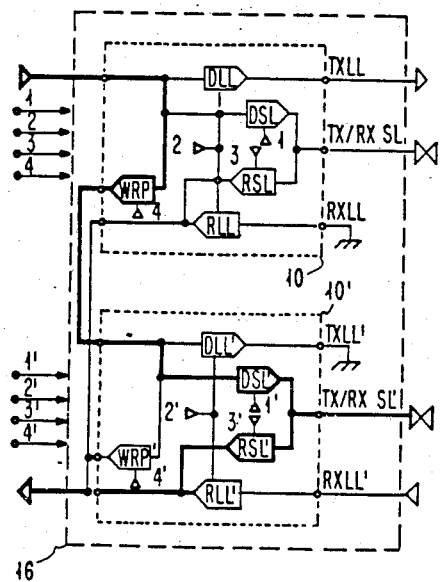
Figure 5E:
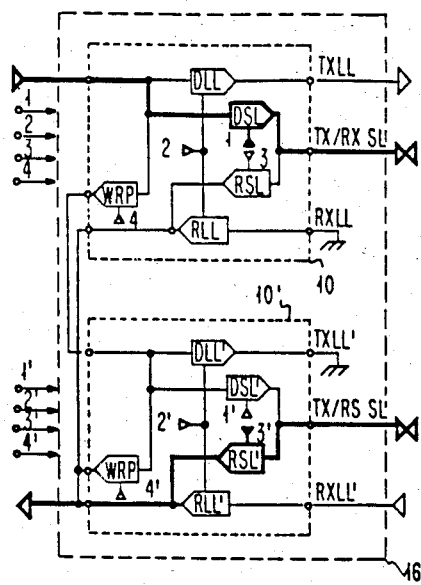
Figure 5F:
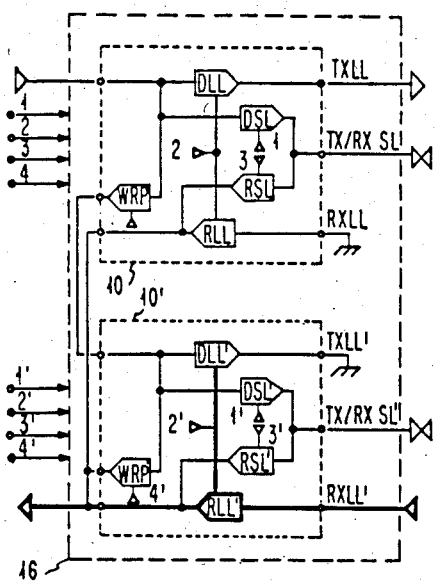
Figure 5G:
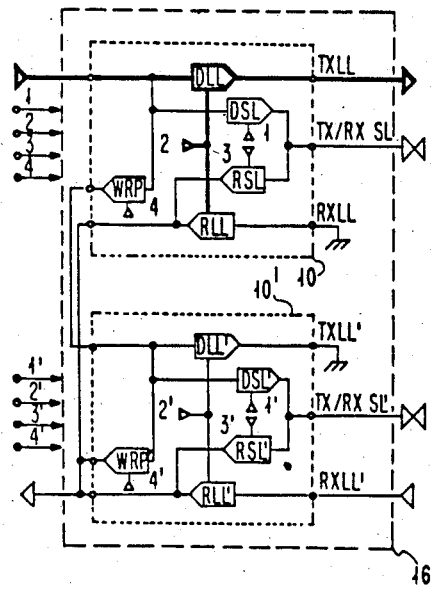
Figure 5H:
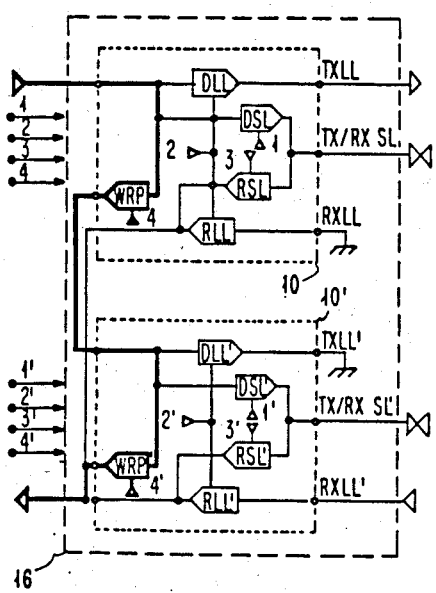

It will be noted that this novel architecture enables a signal to be sent over, or received from, two switched lines, and could be used to provide a bidirectional multiplexing function (see FIGS. 5C and 5D).

While the invention has been particularly shown and described with reference to the preferred embodiments thereof, it will be understood by those skilled in the art that various changes in form and details may be made therein without departing from the spirit and scope of the invention.

Having thus described our invention, what we claim as new, and desire to secure by Letters Patent is:

1. A first interface module (10), integrated in a silicon substrate provided with isolation walls, disposed between on the one hand a modem having both transmitting and receiving portions and on the other hand a plurality of telephone lines, said interface and said modem being respectively connected to power supplies characterized in that it includes:

line amplifier means (DLL, DSL) of the type controlled by a logic control input, disposed between a first terminal (TX DATA) connected to said transmitting portion of the modem and a first pair of said telephone lines (TXLL, TXSL); said line amplifier means exhibit a high output impedance regardless of whether said power supplies are on or off so as not to perturb the telephone lines;

line receiver means (RLL, RSL) of the type controlled by a logic control input, disposed between a second terminal (RX DATA) connected to said receiving portion of the modem and a second pair of said telephone lines (RXLL, RXSL); said line receiver means exhibiting a very high input impedance and serving to isolate the input from the output of said line receiver means regardless of whether said power supplies are on or off; and wrap receiver means (WRP) of the type controlled by a logic control input, disposed between said first terminal (TX DATA) and a third terminal (WRP OUT) for testing the modem to the exclusion of the telephone lines and for the stacking of identical modules.

2. A second interface module (16) obtained by the stacking of two identical first interface modules (10, 10') each constructed according to claim 1 characterized in that:

said third terminal (WRP OUT) of one said first interface module (10) is connected to a said first terminal (TX' DATA) of the other said first interface module (10'), and said third and second terminals (WRP' OUT) and (RX' DATA), of said other interface (10') are connected to said second terminal (RX DATA) of said one interface module (10), and one of said telephone lines (RXLL and TXLL) of said one and said other first interface modules are connected to ground.

3. An interface module (10, 16) according to claim 1 characterized in that said line amplifier means include an operational amplifier (11) of the type having a control input (CTL), a positive input (IN+), a negative input (IN−), an output and being provided with first resistive means (12) connected between said first terminal (TX DATA), said negative input and said output, and second resistive means (12') connected between said positive input and one of said first pair of telephone lines (TXLL), and in that said line amplifier means include further isolation means (D1, D2) connected to power supplies (V+, V−) for providing a very high output impedance regardless of whether the power supplies are on or off, and biasing means (15) for biasing the substrate with respect to the isolation walls.

4. An interface module (10, 16) according to claim 2 characterized in that said line amplifier means include an operational amplifier (11) of the type having a control input (CTL), a positive input (IN+), a negative input (IN−), an output and being provided with first resistive means (12) connected between said first terminal, said negative input and said output, and second resistive means (12') connected between said positive input and one of said first pairs of telephone lines, and in that said line amplifier means include further isolation means (D1, D2) connected to power supplies (V+, V−) for providing a very high output impedance regardless of whether the power supplies are on or off, and biasing means (15) for biasing the substrate with respect to the isolation walls.

5. An interface module (10, 16) according to claim 4, characterized in that said resistive means are implanted resistors provided with correcting means (13, 13') to correct the voltage coefficient of resistance of said implanted resistors to thereby improve the linearity of said line amplifier means.

6. An interface module (10, 16) according to claim 5, characterized in that it further comprises an analog switch (14) connected between a tap or one of said implanted resistors and ground, said switch being controlled via said control input (CTL) of said operational amplifier (11).

7. An interface module (10, 16) according to any one of claims 1 to 6, characterized in that said controlled-type receiver means include an emitter-follower circuit (T16 to T18) an output stage (T20, T21) and a current source (T22, R17), the latter being controlled by a control circuit (T23 to T25, R18) via a logic input (CTL).

8. An interface module (10, 16) according to claim 7, characterized in that the receiver means further comprises isolation means (D3, D4, D5) connected to the power supplies (V+, V−) for providing a very high input impedance and isolating the output of the emitter-follower circuit from said power supplies (V+, V−) regardless of whether said power supplies are on or off.

* * * * *